(12) United States Patent
Ogiso et al.

(10) Patent No.: US 7,057,430 B2
(45) Date of Patent: Jun. 6, 2006

(54) CLOCK SHAPING DEVICE AND ELECTRONIC INSTRUMENT USING THE SAME

(75) Inventors: Hiroyuki Ogiso, Ina (JP); Shinji Nishio, Suwa (JP)

(73) Assignee: Seiko Epson Corporation (JP)

( * ) Notice: Subject to any disclaimer, the term of this patent is extended or adjusted under 35 U.S.C. 154(b) by 1 day.

(21) Appl. No.: 10/791,652

(22) Filed: Mar. 2, 2004

(65) Prior Publication Data

US 2004/0246032 A1    Dec. 9, 2004

(30) Foreign Application Priority Data

Mar. 3, 2003    (JP)    ............ 2003-055962

(51) Int. Cl.
*H03L 7/06*    (2006.01)
(52) U.S. Cl. .................... 327/156; 327/99
(58) Field of Classification Search ........ 327/144–150, 327/156–159, 18–21, 99, 292; 331/16, 1 A, 331/DIG. 2; 375/373–376

See application file for complete search history.

(56) References Cited

U.S. PATENT DOCUMENTS

| | | | |
|---|---|---|---|
| 4,868,513 A | 9/1989 | Piercy et al. | 327/156 |
| 4,868,524 A | 9/1989 | Costlow et al. | 331/16 |
| 5,260,979 A * | 11/1993 | Parker et al. | 375/366 |
| 5,477,330 A * | 12/1995 | Dorr | 358/296 |
| 5,642,069 A * | 6/1997 | Waite | 327/292 |
| 5,828,243 A * | 10/1998 | Bagley | 327/99 |
| 6,362,670 B1 * | 3/2002 | Beaulieu | 327/156 |
| 6,765,424 B1 * | 7/2004 | Zampetti et al. | 327/292 |

FOREIGN PATENT DOCUMENTS

| | | |
|---|---|---|
| JP | 08-274633 | 10/1996 |
| JP | 09-307432 | 11/1997 |

OTHER PUBLICATIONS

Patent Abstract of Japan regarding Publication No. 08-274633 published Oct. 18, 1996.
Patent Abstract of Japan regarding Publication No. 09-307432 published Nov. 28, 1996.

* cited by examiner

*Primary Examiner*—Minh Nguyen
(74) *Attorney, Agent, or Firm*—Harness, Dickey & Pierce, P.L.C.

(57) ABSTRACT

A clock shaping device includes a first clock signal selection portion that selects between a reception clock signal and a back-up clock signal based on a detected loss in the reception clock signal. A second clock signal selection portion selects between a clock signal received from the first clock signal selection portion and a clock signal received from a quartz crystal oscillation circuit based on a detected loss in the back-up clock signal. A voltage controlled oscillation circuit has a frequency that varies with a control voltage being supplied and outputs a feedback loop output signal. A phase comparison portion generates a phase difference signal based on a comparison between the feedback loop output signal and a clock signal outputted from the second clock signal selection portion. A loop filter smoothes the phase difference signal and outputs the phase difference signal in the form of the control voltage.

7 Claims, 8 Drawing Sheets

CLOCK SHAPING DEVICE AND ELECTRONIC INSTRUMENT USING THE SAME

BACKGROUND OF THE INVENTION

1. Technical Field to which the Invention Belongs

The present invention relates to a clock shaping device used as an oscillator for network synchronization, and more particularly to a clock shaping device capable of securing synchronization for a certain period even during a free-run, by switching among a reception clock signal with jitter, a back-up clock signal in sync with a clock signal distributed from a master station, and a quartz crystal oscillation circuit held therein.

2. Prior Art

The role of a clock signal in a network is to distribute a common frequency throughout the network to provide synchronization in the network. A range within which the frequency is distributed depends on the basic configuration of the network, and a network of a network synchronization type is constructed in the case of a long distance communications system. In the network of the network synchronization type, a single master station or quasi-master station distributes a clock signal at the reference frequency (hereinafter, referred to as the reference clock signal), and the reference clock signal is played back in every node within the network so as to be distributed within all the nodes. In this system, all the circuits within the network operate according to the clocks having the same frequency accuracy, which enables transmission/reception processing, such as multiplexing/separation of data, and insertion/extraction of information with the use of a memory, to be performed quite easily.

FIG. 7 is a view schematically showing the configuration of a digital network of a master-slave synchronization system, which is one type of the network synchronization. A reference clock signal for synchronization, having the frequency of f0, is distributed from a master station M to a station A and a station B used as slave stations. As is shown in FIG. 7, transmission/reception processing is normally performed in transmission portions A and B and reception portions A and B, according to a reception clock signal which is timing-extracted from reception data from the transmission path in timing-extracting portions A and B in the transmission apparatus installed in the respective slave stations.

For example, when line trouble occurs in a repeater 1 in a downlink from the slave station A to the slave station B and data cannot be transmitted properly, the slave station B is not able to receive the reception data normally, which makes it impossible to play back the reception clock signal in the timing-extracting portion B in the transmission apparatus B installed in the slave station B. This gives rise to the pulling out of synchronization in the slave station B, and the reception clock signal is switched to a back-up clock signal f0 in a clock supply apparatus B, which is in sync with the reference clock signal distributed from the master station M. The transmission/reception processing is performed according to this back-up clock signal f0 in the transmission apparatus B, which continues until the trouble in the repeater 1 on the transmission path is eliminated. When the trouble is spread and the reception clock signal extracted from the reception data from the repeater 1 is detected as being normal, the back-up clock signal is switched to the reception clock signal.

FIG. 8 is a block diagram showing the configuration of a conventional clock shaping device used in the transmission apparatus or the like forming the master-slave synchronized communications system. The clock shaping device is generally referred to as a jitter lowering circuit, and adopts the configuration that uses a PLL circuit having a voltage controlled oscillation circuit VCO or the like. In order to improve the phase noise and the jitter characteristic, as is shown in FIG. 8, some types of the clock shaping device use a voltage controlled quartz crystal oscillator VCXO or a voltage controlled SAW oscillator (VCSO) using a SAW (Surface Acoustic Wave) resonator instead of the voltage controlled oscillator VCO.

Into an input terminal FIN of the clock shaping device shown in FIG. 8 is inputted either of the clock signals (the reception clock signal in a normal state) selected in an unillustrated selection portion that switches between the reception clock signal and the back-up clock signal. A phase comparison portion 11 compares the phases between the clock signal thus inputted and a clock signal from a voltage controlled SAW oscillator (VCSO) 13a. The resulting phase difference signal is outputted to a loop filter 12, so that it is used as a control voltage Vc for frequency control in the voltage controlled SAW oscillator (VCSO) 13a. In this instance, when an omission of several clocks is detected in the clock signal inputted into the phase comparison portion 11, this information is outputted to the outside from an output terminal ALM in the form of an alarm signal, which is one of the factors to switch the clock signals to be inputted into the clock shaping device.

A communications device represented by an electronic instrument in recent years has achieved significant speed-ups as its communication speed is shifted to a GHz band. Hence, the oscillator or the clock shaping device used in the communications device has to meet the following: (1) the frequency stability is high in a high frequency band; (2) temperature compensation is ensured in a operating temperature range of the communications device; and further (3) jitter in the clock signal outputted from the oscillation circuit or the like is lowered markedly.

In addition, as the transmission apparatus or the like used in the network synchronization system described above reduces the size and the cost, there has been a strong need for a smaller, low-cost component, including the clock shaping device, used in the transmission apparatus or the like.

Incidentally, JP-A-8-274633 (Paragraph [0022], FIG. 1) and JP-A-9-307432 (Paragraph [0019], FIG. 1) have disclosed prior arts related to a PLL circuit that receives inputs of two clock signals used as the reference and generates a clock signal in sync with the either clock signal selected therefrom. JP-A-8-274633 (Paragraph [0022], FIG. 1) aims to improve the response characteristic when the reference clock signals are switched by an input detection circuit. JP-A-9-307432 (Paragraph [0019], FIG. 1) aims to improve the phase deviation of an output clock that depends on a phase difference between the two reference clock signals when the reference clock signals are switched by a selection control portion.

The system and the clock shaping device described above have problems (issues) such as the following.

There is an issue such that, when the reception clock signal is switched to the back-up clock signal in the event of an error in the reception clock signal, a time lag is generated due to a delay of an operation in the control system or an operation in the functional block, such as the switching switch forming the selection portion or the like, and the delay time thus generated delays the synchronous compensation with respect to the trouble.

Also, in the event of trouble in the reception clock signal or the back-up clock signal, the conventional clock shaping device can do nothing but outputs an omission in the back-up clock signal in the form of an alarm, and there is an issue that the clock shaping device cannot activate synchronous compensating means until the trouble or the like is spread.

In addition, there is an issue that a clock signal is outputted without any compensation for the frequency accuracy in a free-run state when neither the reception clock signal nor the back-up clock signal is inputted into the clock shaping device.

Further, in the PLL circuit configuration used in the conventional clock shaping device, it takes some time to detect an omission in the clock signal being inputted and output the detection to the outside in the form of an alarm signal due to the time needed as a lock-up time, and there is an issue that the synchronous compensation is delayed.

Also, as is shown in FIG. 9, some types of the conventional clock shaping device use an output of the voltage controlled quartz crystal oscillator VCO or the voltage controlled SAW oscillator VCSO as an output of the clock shaping device and also as a feedback loop output of the PLL circuit.

However, it is not easy to achieve matching, such as impedance matching, in an input/output interface and a transmission path (in this case, a wiring line path for connection) in a high frequency range at several hundred MHz or higher, during the delivery of the clock signal in these configurations. Hence, there is an issue that the level of the output amplitude is lowered due to mutual influence, and an issue that unbalance or a phase difference is generated in the output amplitude between the positive and negative outputs in the case of a differential output, which causes jitter to be generated.

In order to avoid such influence, as is shown in FIG. 10, an output buffer driver IC (a buffer 14b in the drawing) fabricated in the form of an integrated circuit (hereinafter, abbreviated to IC) is inserted separately in each output portion of the voltage controlled quartz crystal oscillation circuit or the voltage controlled SAW oscillation circuit. In this case, there is an issue that the number of components is increased by adding the output buffer driver IC, which makes a reduction in size and cost difficult.

The invention was devised to eliminate the issues described above, and therefore has an object to provide a clock shaping device capable of performing synchronous compensation early in a case where synchronization is lost due to trouble in the reception clock signal or the back-up clock signal. Also, the invention has an object to provide a clock shaping device capable of performing synchronous compensation with the use of a quartz crystal oscillation circuit held in the clock shaping device even when these clock signals are not supplied. In addition, the invention has an object to achieve a clock shaping device that does not give direct influence to the clock signal when an output of the voltage controlled oscillation circuit is used as a feedback loop output, and that does not generate jitter due to unbalance or a phase difference in output amplitude between the positive and negative outputs in the case of a differential output. Further, the invention has an object to achieve a smaller, low-cost clock shaping device by decreasing the number of components without adding the output buffer driver IC. Furthermore, the invention has an object to provide an electronic instrument using a clock shaping device adapted to the foregoing objects, for example, an electronic instrument capable of achieving synchronous compensation early in the synchronization system with the use of an optical transceiver module.

SUMMARY

A clock shaping device of the invention is a clock shaping device, provided in a transmission apparatus and compensating for network synchronization, for receiving an input of a back-up clock signal in sync with a reference clock signal from a master station or a quasi-master station and supplied from a clock supply apparatus and an input of reception data from a transmission path, and generating a reception clock signal through timing-extraction from the reception data, the device being characterized by including: a first clock signal selection portion that receives an input of the reception clock signal and an input of the back-up clock signal, selects either of the clock signals by a first selection signal inputted from outside, monitors, when the reception clock signal is being selected, a loss in the selected reception clock signal, and switches the selected reception clock signal to the back-up clock signal upon detection of the loss; a quartz crystal oscillation circuit that oscillates at a predetermined frequency; a second clock signal selection portion that receives an input of a clock signal from the first clock signal selection portion and an input of a clock signal from the quartz crystal oscillation circuit, selects either of the clock signals by a second selection signal inputted from outside, monitors, when the back-up clock signal is being selected, a loss in the selected back-up clock signal, and switches the back-up clock signal to the clock signal from the quartz crystal oscillation circuit upon detection of the loss; a voltage controlled oscillation circuit whose frequency varies with a control voltage being supplied, and generates and outputs a feedback loop output signal; a phase comparison portion that generates a phase difference signal based on a result of comparison between the feedback loop output signal from the voltage controlled oscillation circuit and a clock signal outputted from the second clock signal selection portion; and a loop filter that smoothes the phase difference signal and outputs the phase difference signal in the form of the control voltage.

According to the above configuration, the securing of synchronization in the system can be compensated for by the back-up clock signal when an omission occurs in the reception clock signal for a certain time. Further, there can be achieved an advantage that, in a case where an omission similar to the aforementioned omission occurs also in the back-up clock signal, the securing of synchronization in the system can be compensated for by the clock signal according to the quartz crystal oscillation circuit held in the clock shaping device for which the frequency accuracy is compensated.

A clock shaping device of the invention is characterized in that the voltage controlled oscillation circuit includes: a voltage controlled phase-shift circuit that outputs an output signal by shifting a phase of an input signal by a certain quantity with the control voltage; a SAW resonator that resonates at a predetermined resonance frequency; an oscillation differential amplifier that amplifies a resonance signal at the predetermined resonance frequency and outputs the resonance signal; and a feedback buffer differential amplifier that receives an input of an output signal from the oscillation differential amplifier, and in that a forward feedback oscillation loop is formed from at least the voltage controlled phase-shift circuit, the SAW resonator, the oscillation differential amplifier, and the feedback buffer differential amplifier, so that one of an inverting output terminal and a non-inverting output terminal provided to the feedback buffer differential amplifier outputs the feedback loop output signal and the other output terminal outputs a forward feedback oscillation loop output signal.

According to the above configuration, by avoiding mutual influence between the output of the voltage controlled oscillation circuit and the feedback loop output, it is possible to prevent the level of the output amplitude from being lowered, and to eliminate unbalance or a phase difference in output amplitude between the output terminals in the case of a differential amplifier. As a consequence, there can be achieved an advantage that the generation of jitter induced by the lowered level, unbalance, etc. can be prevented. Also, it is no longer necessary to insert an output buffer driver IC formed from individual components at the output portion of the voltage controlled oscillation circuit in order to avoid the foregoing influence, and an increase of the number of components can be suppressed. It is thus possible to achieve an advantage that the size and the cost can be reduced.

A clock shaping device of the invention is characterized in that the voltage controlled oscillation circuit includes: a voltage controlled phase-shift circuit that outputs an output signal by shifting a phase of an input signal by a certain quantity with the control voltage; a SAW resonator that resonates at a predetermined resonance frequency; an oscillation amplifier that amplifies a resonance signal at the predetermined resonance frequency and outputs the resonance signal; and a feedback buffer amplifier that receives an input of an output signal from the oscillation amplifier, and in that: a forward feedback oscillation loop is formed from at least the voltage controlled phase-shift circuit, the SAW resonator, the oscillation amplifier, and the feedback buffer amplifier; plural output amplifiers are further included; and an output signal from the oscillation amplifier is branched via the plural output amplifiers, and any one of output signals is used as the feedback loop output signal.

According to the above configuration, the need to add an extra component, such as an external output buffer driver IC, can be eliminated, and an increase of the number of components can be reduced. It is thus possible to achieve an advantage that the size and the cost can be reduced.

A clock shaping device of the invention is characterized in that the first clock signal selection portion includes: a first selection portion that receives an input of the reception clock signal and an input of the back-up clock signal, and selects and outputs either of the clock signals by the first selection signal; a reception clock signal loss detection portion that detects a loss in the reception clock signal when the reception clock signal is being selected in the first selection portion, and outputs the detection to the first selection portion in the form of a first switching signal, and in that the first clock signal selection portion switches the reception clock signal to the back-up clock signal by the first switching signal given with precedence over the first selection signal.

According to the above configuration, there can be achieved an advantage that the (forced) switching by the first switching signal given with precedence over the first selection signal can compensate for the securing of synchronization early, even when a delay in detection of an error, such as an omission, or a delay of the switching operation occurs in another apparatus or functional block.

A clock shaping device of the invention is characterized in that the second clock signal selection portion includes: a second selection portion that receives an input of a clock signal outputted from the first clock signal selection portion and an input of a clock signal outputted from the quartz crystal oscillation circuit, and selects and outputs either of the clock signals by the second selection signal; and a back-up clock signal loss detection portion that detects a loss in the back-up clock signal when the back-up clock signal is being selected in the second selection portion, and outputs the detection to the second selection portion in the form of a second switching signal, and in that the second clock signal selection portion switches the back-up clock signal to the clock signal from the quartz crystal oscillation circuit by the second switching signal given with precedence over the second selection signal.

According to the above configuration, there can be achieved an advantage that the (forced) switching by the second switching signal given with precedence over the second selection signal can compensate for the securing of synchronization early, even when a delay in detection of an error, such as an omission, or a delay of the switching operation occurs in another apparatus or functional block.

A clock shaping device of the invention is characterized in that the phase comparison portion includes: first dividing means for dividing a clock signal selected by the second clock signal selecting means; and second dividing means for dividing the feedback loop output signal.

According to the above configuration, the clock signals inputted when phase comparison is performed can be compared at low frequencies. It is thus possible to achieve an advantage that an inexpensive, highly accurate phase comparison portion can be fabricated in the form of a low-speed IC.

A clock shaping device of the invention is characterized in that: each of the oscillation differential amplifier and the feedback buffer differential amplifier is a differential amplifier circuit using an ECL line receiver.

According to the above configuration, an integrated circuit can be readily fabricated. It is thus possible to achieve an advantage that not only can the size and the power consumption of the voltage controlled oscillation circuit be reduced, but also the voltage controlled oscillation circuit is allowed to operate at a high speed.

An electronic instrument of the invention is characterized by being provided with any of the clock shaping devices described above.

According to the above configuration, the forced switching given with precedence over the selection signal from the outside can compensate for the securing of synchronization early, even when a delay in detection of an error, such as an omission, or a delay of the switching operation occurs in an external apparatus or another functional block. Also, there can be achieved an advantage that an electronic instrument capable of compensating for the securing of synchronization by the clock signal from the quartz crystal oscillation circuit held in the clock shaping device, for example, an optical transceiver module, can be provided.

DETAILED DESCRIPTION

Embodiments of the invention will now be described with reference to the drawings.

Figure 1:
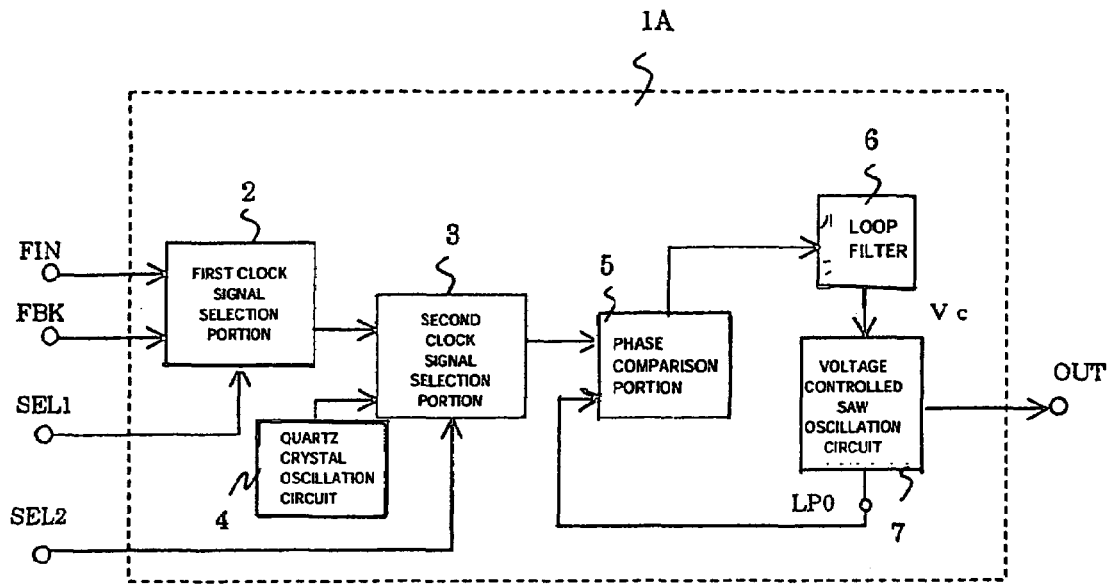
FIG. 1 is a block diagram showing the configuration of a clock shaping device according to a first embodiment.

(1) FIRST EMBODIMENT (1-1) Configuration Of First Embodiment
Configuration of Clock Shaping Device 1A FIG. 1 is a block diagram showing the configuration of a clock shaping device 1A according to a first embodiment of the invention.

Referring to FIG. 1, the clock shaping device 1A comprises: a first clock signal selection portion 2 that selects either the reception clock signal or the back-up clock signal from the outside and monitors a loss in the reception clock signal when the reception clock signal is being selected; a second clock signal selection portion 3 that selects either the clock signal selected in the first clock signal selection portion 2 or a clock signal from a quartz crystal oscillation circuit 4 and monitors a loss in the back-up clock signal when the back-up clock signal is being selected; a phase comparison portion 5 that compares the clock signal from the second clock signal selection portion 3 with a feedback loop output signal and thereby generates a phase difference signal on the basis of the comparison result; a loop filter 6 that smoothes the phase difference signal and outputs the resulting signal in the form of a control voltage Vc; and a voltage controlled oscillation circuit 7 whose frequency of an output signal varies with the control voltage Vc.

The voltage controlled oscillation circuit 7 can be either a voltage controlled quartz crystal oscillation circuit using an AT cut quartz crystal resonator or a voltage controlled SAW oscillation circuit using a SAW resonator. This embodiment of the invention will describe a case where the voltage controlled SAW oscillation circuit using the SAW resonator is used.

A first characteristic of the clock shaping device according to the first embodiment of the invention is that two clock signal selection portions, the first clock signal selection portion 2 and the second clock signal selection portion 3, are provided in the preceding stage of the conventional phase comparison portion. In the event of a loss in the reception clock signal, the first clock signal selection portion 2 detects the loss, and switches the reception clock signal to the back-up clock signal. Further, in the event of a loss in the back-up clock signal, the second clock signal selection portion 3 detects the loss, and switches the back-up clock signal to a clock signal from the quartz crystal oscillation circuit 4 held in the clock shaping device 1A, and the synchronous compensation continues until the trouble is spread. Although it will be described in detail with reference to FIG. 2, in a case where a loss in each of the reception clock signal and the back-up clock signal is detected in the respective clock signal selection portions at the occurrence of trouble, the reception clock signal is switched to the back-up clock signal or the clock signal from the quartz crystal oscillation circuit 4 (forcibly) with precedence over a selection signal from the outside. A loss in the clock signal referred to herein means a state where a clock signal is omitted for a certain time. In other words, it means, for example, a short-time omission state like an instantaneous interruption or a state where the omission continues for a relatively long time because a clock signal is not generated due to trouble in the transmission apparatus or in a line.

Figure 3:
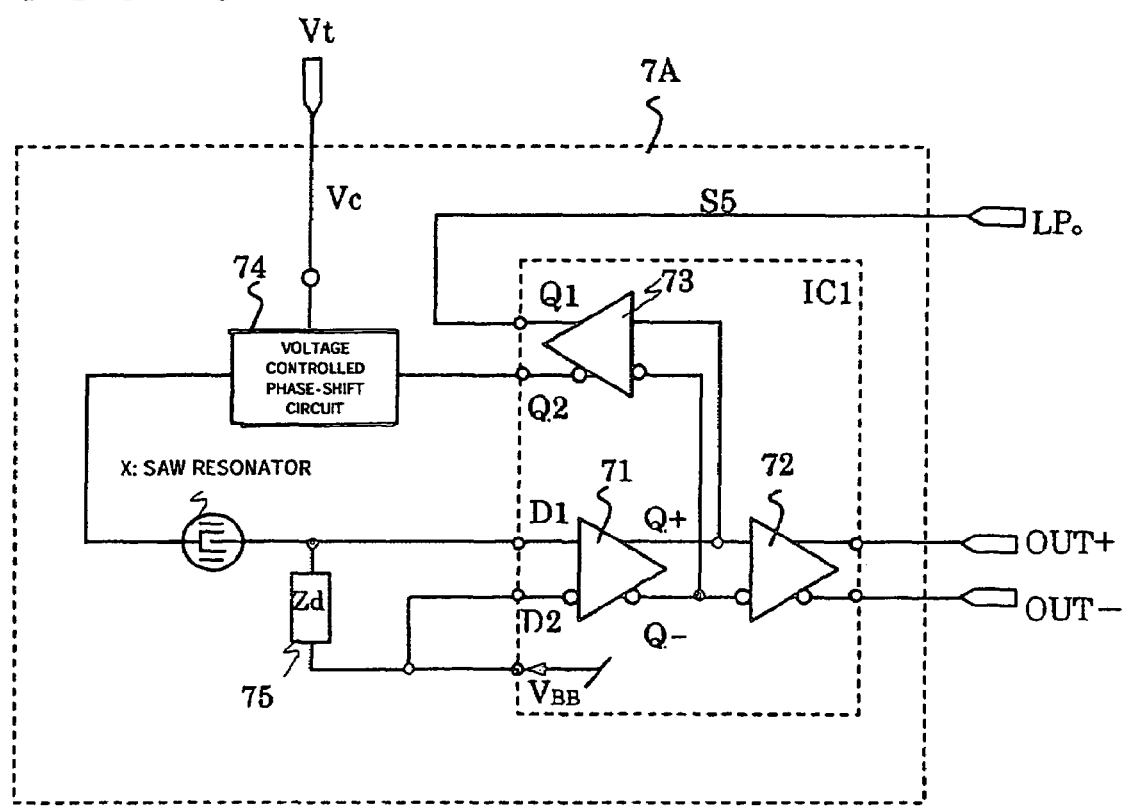
FIG. 3 is a block diagram showing in detail the configuration of a voltage controlled SAW oscillation circuit.

A second characteristic of the clock shaping device 1A of the first embodiment is that an output from a feedback buffer differential amplifier in a voltage controlled SAW oscillation circuit 7A, which will be described in detail with reference to FIG. 3, is used as a feedback loop output in the clock shaping device 1A. In short, referring to FIG. 1, a feedback loop output terminal LP0 of the voltage controlled SAW oscillation circuit 7 is used.

Figure 2:
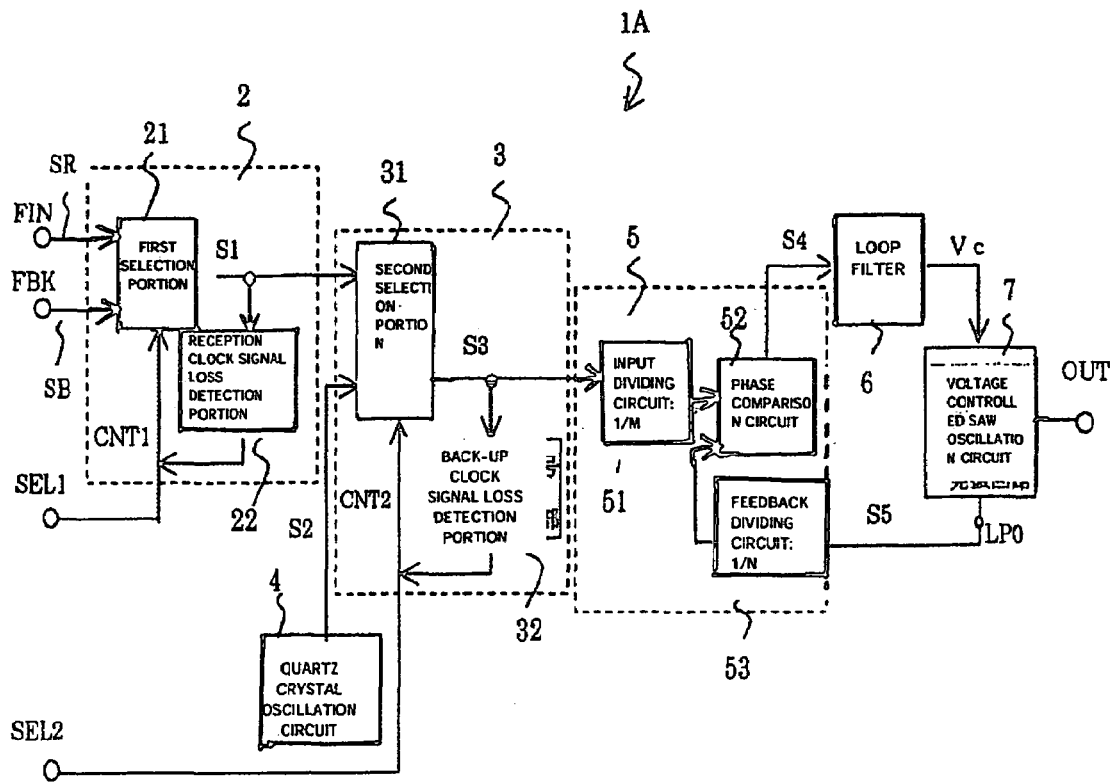
FIG. 2 is a block diagram showing in more detail the configuration of each functional block in the clock shaping device according to the first embodiment.

FIG. 2 is a block diagram showing more in detail the configuration of each functional block of the clock shaping device 1A described above. Also, FIG. 3 is a block diagram showing the configuration of the voltage controlled SAW oscillation circuit 7A.

Referring to FIG. 2, the first clock signal selection portion 2 comprises: a first selection portion 21 that receives an input of a reception clock signal SR and an input of a back-up clock signal SB from the outside, and selects either of these signals by a first selection signal from the outside; and a reception clock signal loss detection portion 22 that detects a loss in a reception clock signal S1 when the reception clock signal SR is being selected.

Assume that the reception clock signal is a clock signal timing-extracted from the reception data from the transmission path, and the back-up clock signal is a clock signal supplied from an unillustrated, outside clock supply apparatus, which is in sync with the reference clock signal of the master station (main station) or a quasi-master station (quasi-main station).

The reception clock signal loss detection portion 22 monitors the selected reception clock signal S1, and upon detection of a loss therein, transmits a first switching signal CNT1 to the first selection portion 21. The first selection portion 21 then forcibly switches the reception clock signal S1 to the back-up clock signal SB being inputted, by the first switching signal CNT1 given with precedence over the first selection signal CNT1 from the outside. After the switching to the back-up clock signal S1, the reception clock signal loss detection portion 22 does not monitor the back-up clock signal.

The second clock signal selection portion 3 comprises: a second selection portion 31 that receives an input of the clock signal S1 selected in the first clock signal selection portion 2 and an input of a clock signal S2 from the quartz crystal oscillation circuit 4 and selects either of these signals by a second selection signal CNT2 from the outside; and a back-up clock signal loss detection portion 32 that detects a loss in a selected back-up clock signal S3.

The back-up clock signal loss detection portion 32 monitors the back-up clock signal S3 selected in the first selection portion 21 and the second selection portion 31, and upon detection of a loss in the back-up clock signal S3, transmits a second switching signal CNT2 to the second selection portion 21. The second selection portion 31 then forcibly switches the back-up clock signal S3 to the clock signal S2 from the quartz crystal oscillation circuit 4 by the second switching signal CNT2 given with precedence over the second selection signal CNT2 form the outside. After the switching to the normal reception clock signal SR or the clock signal S2 from the quartz crystal oscillation circuit 4, the back-up clock signal loss detection portion 32 monitors neither of these clock signals.

The quartz crystal oscillation circuit 4 is used as a clock signal to secure temporal synchronization in circumstances where the occurrence of an omission continues in both the reception clock signal SR and the back-up clock signal SB described above. The quartz crystal oscillation circuit 4 can be either an oscillation circuit using an AT cut quartz crystal resonator or an oscillation circuit using a SAW resonator.

The forced switching by the reception clock signal loss detection portion 22 or the back-up clock signal loss detection portion 32 is advantageous in compensating for a delay in securing synchronization when an error, such as an omission, is detected or a time delay is generated in an operation to compensate for the error on the system side for some reason.

The phase comparison portion 5 comprises: an input dividing circuit (dividing ratio: 1/M, first dividing means) 51 and a feedback dividing circuit (dividing ratio: 1/N, second dividing means) 53 provided to the two input sides, respectively; and a phase comparison circuit 52. The dividing circuits are used to lower the frequency of a clock signal to be inputted at a high frequency. The clock signal S3 outputted from the second selection portion 31 and a feedback loop output signal S5 from the voltage controlled SAW oscillation circuit 7 are divided in the input dividing circuit 51 and the feedback dividing circuit 53, respectively. Then, the phases of these clock signals are compared, and a signal at a voltage level corresponding to the phase difference is outputted to the loop filter 6.

Because the phase comparison portion 5, in which the input dividing circuit 51 and the feedback dividing circuit 53 are included in addition to the phase comparison circuit 52, can be readily formed from a low frequency circuit, it can be readily fabricated as an IC.

The loop filter 6 smoothes a signal at the voltage level corresponding to the phase difference outputted from the phase comparison circuit 52, and outputs the resulting signal to the voltage controlled SAW oscillation circuit 7 in the form of the control voltage Vc.

The voltage controlled SAW oscillation circuit 7 is a voltage controlled oscillation circuit that oscillates a SAW resonator X described below with reference to FIG. 3, and outputs a clock signal whose frequency varies in a range, for example, from several tens of MHz to several hundred MHz, in proportion to the voltage level of the control voltage Vc.

Configuration of Voltage Controlled SAW Oscillation Circuit 7A

The configuration of the voltage controlled SAW oscillation circuit 7A will now be described with reference to FIG. 3.

Referring to FIG. 3, the voltage controlled SAW oscillation circuit 7A comprises, at least: an IC1, which is an IC composed of three differential amplifiers, including an oscillation differential amplifier 71, an output differential amplifier 72, and a feedback buffer differential amplifier 73; a voltage controlled phase-shift circuit 74 that adjusts a quantity of phase-shift within a forward feedback oscillation loop; a SAW resonator X having a predetermined resonance frequency; and an impedance circuit (ZD) 75. Also, the forward feedback oscillation loop is formed from at least the oscillation differential amplifier 71, the feedback buffer differential amplifier 73, the voltage controlled phase-shift circuit 74, and the SAW resonator X.

Figure 4:
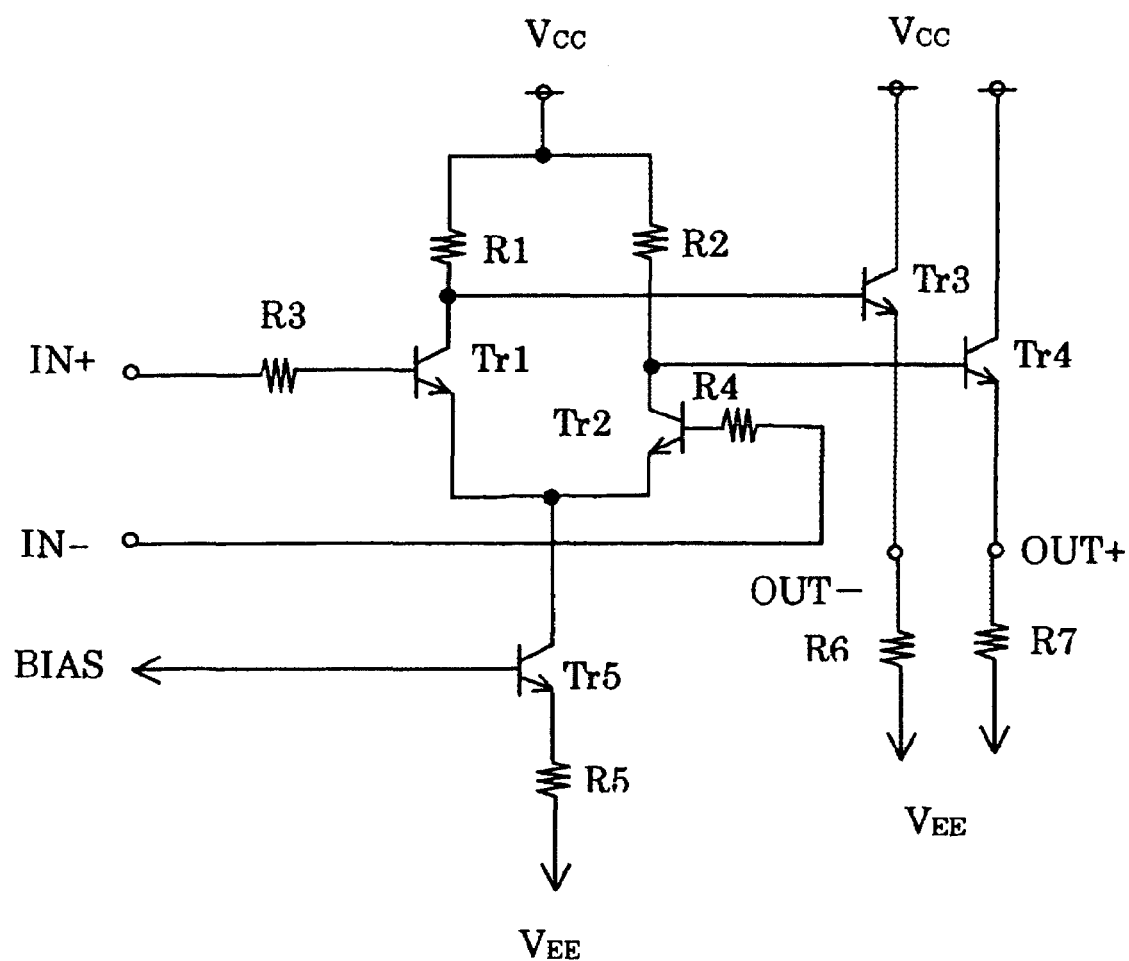
FIG. 4 is a circuit diagram showing the concrete configuration of en ECL line receiver.

Each of the oscillation differential amplifier 71, the output differential amplifier 72, and the feedback buffer differential amplifier 73 is a differential amplifier circuit using an ECL line receiver (emitter-coupled logic). FIG. 4 is a circuit diagram showing the concrete configuration of the ECL line receiver. The ECL line receiver is a differential amplifier circuit having non-inverting and inverting differential inputs and differential outputs. The ECL line receiver is used for a circuit that needs to operate at high speeds like the voltage controlled SAW oscillation circuit at lower power consumption, and the resulting output signal can be used for conversion of the electric level used in the ECL differential amplifier circuit.

The SAW (Surface Acoustic Wave) resonator attracts attention as a device that oscillates at a high frequency. The SAW resonator is a resonator using the property that energy concentrates in the vicinity of the surface of an elastic body and then propagates. A blind-shaped exciting electrode is placed on a piezoelectric substrate, and the surface wave excited by the exciting electrode is reflected to generate a stationary wave so as to function as a resonator. The SAW resonator has a resonance frequency from several hundred MHz to several GHz and is used for a high frequency oscillation circuit. Also, the SAW resonator has a characteristic that it will not become a jitter-generating factor because the main vibration alone is present and unwanted vibration is absent therein.

A terminal at the latter stage of the forward feedback oscillation loop of the SAW resonator X that generates and outputs a resonance signal is connected to the non-inverting input terminal D1 of the oscillation differential amplifier 71.

Between the non-inverting input terminal D1 and the inverting input terminal D2 of the oscillation differential amplifier 71 is connected the impedance circuit (ZD) 75 used to generate a predetermined potential difference between the respective input terminals. Further, a bias voltage VBB outputted from the IC1 is applied to the inverting input terminal D2 of the oscillation differential amplifier 71. It may be configured in such a manner that a resonance signal from the SAW resonator X is inputted to the inverting input terminal D2 of the oscillation differential amplifier 71, and the bias voltage VBB is inputted to the non-inverting input terminal D1.

The non-inverting input terminal of the feedback buffer differential amplifier 73 is connected to the non-inverting output terminal Q+ of the oscillation differential amplifier 71, and the inverting input terminal of the feedback buffer differential amplifier 73 is connected to the inverting output terminal Q− of the oscillation differential amplifier 71. A signal outputted from the non-inverting output terminal Q1 of the feedback buffer differential amplifier 73 is used as a feedback loop output signal to the phase comparison portion 5 shown in FIG. 1 via the output terminal LP0. Also, a signal outputted from the non-inverting output terminal Q2 is inputted to the voltage controlled phase-shift circuit 74 as a forward feedback oscillation loop output signal. Alternatively, the output of the non-inverting output terminal Q1 may be used as the forward feedback oscillation loop output signal, and the output of the non-inverting output terminal Q2 may be used as the feedback loop output signal to the outside phase comparison portion 5.

Into the voltage controlled phase-shift circuit 74 is inputted the control voltage Vc, which is outputted from the loop filter 6 shown in FIG. 1 via the voltage control terminal Vt, and a quantity of phase-shift in the forward feedback oscillation loop is thereby controlled.

The output differential amplifier circuit 72 is connected to the latter stage of the non-inverting output terminal Q+ and the inverting output terminal Q− of the oscillation differential amplifier 71, and the oscillation waveform is subjected to waveform shaping, and is then outputted via the output terminals OUT+ and OUT− in the form of a clock signal.

In the voltage controlled SAW oscillation circuit 7A described above, three differential amplifiers 71, 72, and 73 indicated as the IC1 except for the SAW resonator X or the like are commercialized as general integrated circuits and are therefore readily available. It is thus possible to omit some design steps to integrate the oscillation circuit.

In a case where the clock shaping device 1A is achieved by using the voltage controlled SAW oscillation circuit utilizing an output of the feedback buffer differential amplifier, there will be no mutual interference between an external output and the feedback loop output of the voltage controlled SAW oscillation circuit. In addition, a load circuit can be directly connected to the output of the voltage controlled SAW oscillation circuit without connecting the output buffer driver IC externally, so that it can be used as an output of the clock shaping device 1A.

(1-2) Operations in First Embodiment

Operations in the first embodiment of the invention will now be described with reference to FIG. 2 and FIG. 3.

Normal Operation

Initially, a case where the reception clock signal SR inputted from the outside is normal will be described.

Referring to FIG. 2, the reception clock signal SR is inputted to the input terminal FIN and the back-up clock signal SB is inputted to the input terminal FBK independently. The reception clock signal SR is selected in the first selection portion 21 by the first selection signal CNT1 inputted from the control terminal SEL1. The selected reception clock signal S1 is inputted to the second selection portion 31 together with the clock signal S2 from the quartz crystal oscillation circuit 4, and the reception clock signal S1 is further selected by the second selection signal CNT2 inputted from the control terminal SEL2. The selected reception clock signal S3 and the feedback loop clock signal S5 from the output terminal LP0 of the voltage controlled SAW oscillation circuit 7 are inputted to the phase comparison portion 5, and divided in the input dividing circuit 51 and the feedback dividing circuit 53, respectively. Then, the phases are compared in the phase comparison circuit 52 on the basis of each divided low-frequency clock signal. The comparison result is outputted in the form of a phase difference signal S4, and the loop filter 6 smoothes the phase difference signal S4 and outputs the resulting signal to the voltage controlled SAW oscillation circuit 7 in the form of the control voltage Vc.

In the voltage controlled phase-shift circuit 74 shown in FIG. 3, the phase of the clock signal outputted from the inverting output terminal Q2 of the feedback buffer differential amplifier 73 is adjusted to an adequate phase on the basis of the control voltage Vc inputted from the voltage control terminal Vt. The clock signal from the non-inverting output terminal Q1 of the feedback buffer differential amplifier 73 is then outputted in the form of the feedback loop output signal S5 of the clock shaping device 1A via the feedback loop output terminal LP0, and inputted to the phase comparison portion 5 shown in FIG. 2.

Erroneous Operation

Operations in the event of an error, such as an omission, in the reception clock signal SR or the back-up clock signal SB inputted from the outside will now be described. Herein, operations will be described on the assumption that the clock shaping device detects an error at the earliest stage, due to a delay in detection of an error or a delay of the switching operation in another system or transmission apparatus, etc.

Assume a state that transmission of data is not performed normally due to the occurrence of line trouble on the transmission path and the reception data is not timing-extracted normally, for example, the occurrence of an omission in the reception clock signal SR continues for a certain time. In this case, an omission is occurring also in the reception clock signal S1 selected in the first selection portion 21 shown in FIG. 2, and this omission is detected by the reception clock signal loss detection portion 22. The reception clock signal loss detection portion 22 then generates the first switching signal CNT1 and outputs the same to the first selection portion 21. In the first selection portion 21, the reception clock signal S1 is forcibly switched to the back-up block signal SB by this first switching signal CNT1, and the synchronization is thus compensated for on the basis of the back-up clock signal SB.

Further, for example, assume that an error, such as an omission, occurs in an unillustrated clock supply apparatus installed in the slave station, and the occurrence of a loss in the back-up clock signal SB also continues for a certain period. In this case, the omission in the back-up clock signal S1 selected in the first selection portion 21 is detected in the back-up clock signal loss detection portion 32, and the detection portion 32 then generates the second switching signal CNT2 and outputs the same to the second selection portion 31. In the second selection portion 31, the back-up clock signal SB is forcibly switched to the clock signal S2 from the quartz crystal oscillation circuit 4 by the second switching signal CNT2, and the synchronization is thus compensated for on the basis of the clock signal S2.

Operations after the switching to the back-up clock signal or the clock signal from the quartz crystal oscillation circuit 4 are performed in the same manner as those in the normal state, and the detailed description thereof is omitted.

(1-3) Advantage Achieved in First Embodiment

As has been described, according to the first embodiment of the invention, the advantages such as the following can be achieved.

The first clock signal selection portion that selects either the reception clock signal or the back-up clock signal from the outside, and the second clock signal selection portion that selects either the clock signal outputted from the first clock signal selection portion or the clock signal from the quartz crystal oscillation circuit are provided. It is thus possible to secure the synchronization in the system according to the back-up clock signal when en error, such as an omission, occurs in the reception clock signal. Further, there can be achieved an advantage that, when an error, such as an omission, occurs also in the back-up clock signal, the synchronization in the system can be secured by the clock signal according to the quartz crystal oscillation circuit held in the clock shaping device.

Also, when a loss is occurring in the selected clock signal per se, the first and second clock signal selection portions are able to detect the loss by means of the reception clock signal loss detection portion or the back-up clock signal loss detection portion, thereby forcibly switching the clock signals. By the forced switching performed with precedence over the selection signal from the outside, it is possible to achieve an advantage that the synchronization can be secured early, even when a delay in detection or a delay of the switching operation occurs in another apparatus or functional block.

Also, this embodiment adopts the configuration that an output from either of the output terminals, that is, the non-inverting output terminal and the inverting output terminal, of the feedback buffer differential amplifier in the voltage controlled SAW oscillation circuit is used as a feedback loop output. This configuration prevents the level of the output amplitude from being lowered due to mutual influence, and makes it possible to avoid adverse influence like unbalance or a phase difference in output amplitude between the non-inverting and inverting output terminals in the case of a differential amplifier. It is thus possible to achieve an advantage that jitter generated by the foregoing influence can be eliminated.

Also, it is no longer necessary to insert an output buffer driver IC comprising individual components to the output portion of the voltage controlled SAW oscillation circuit in order to avoid the foregoing influence, and the number of components can be reduced. It is thus possible to achieve an effect that the size and the cost can be reduced.

Also, the phase comparison portion includes two dividing circuits having dividing ratios corresponding to the frequencies of the clock signals to be inputted, and is thereby able to compare the signals at low frequencies in the phase comparison circuit. It is thus possible to achieve an advantage that an inexpensive, highly accurate phase comparison portion can be fabricated in the form of a low-speed IC.

(2) SECOND EMBODIMENT (2-1) Configuration of Second Embodiment

Figure 5:
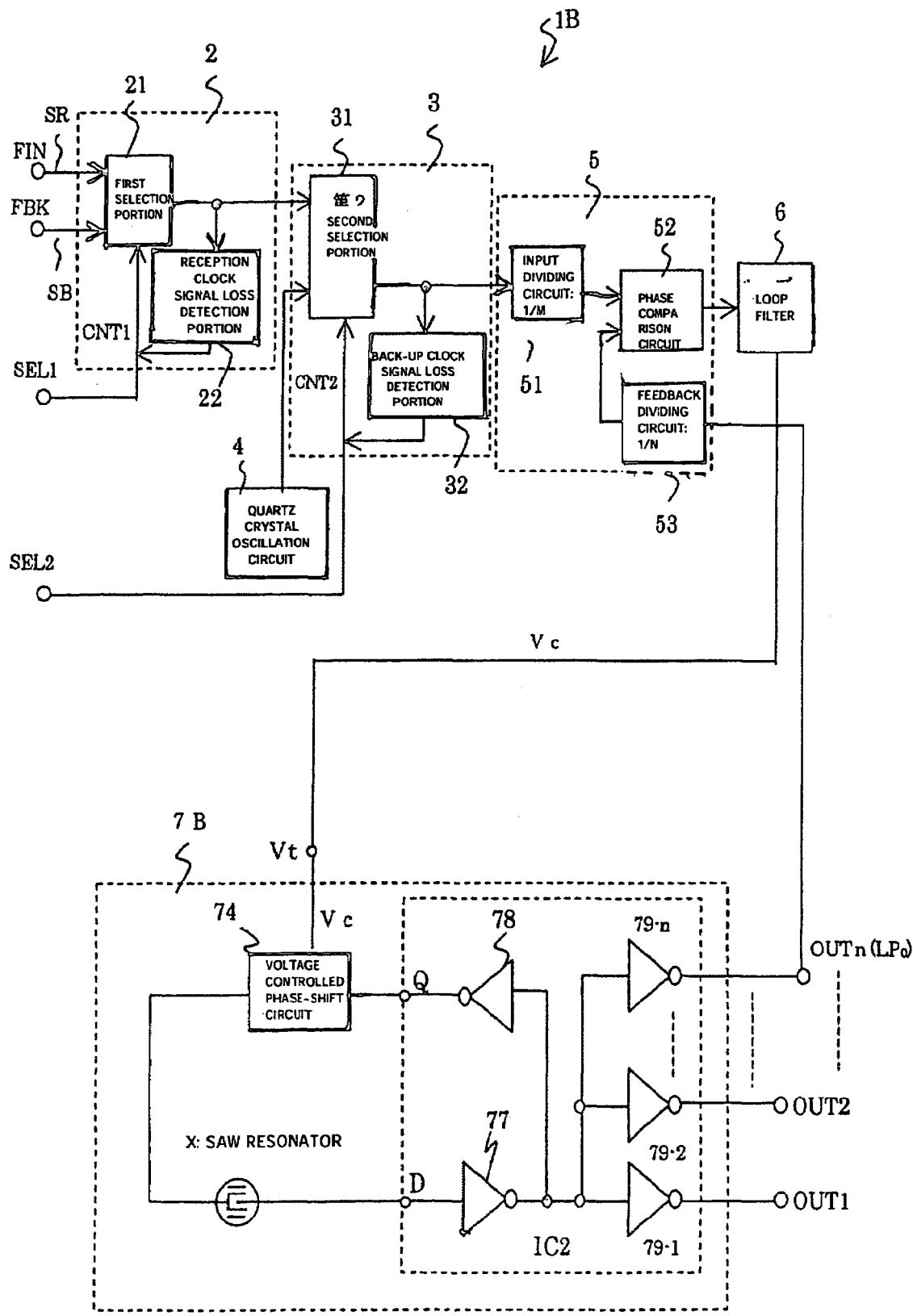
FIG. 5 is a block diagram showing the configuration of a clock shaping device according to a second embodiment.

FIG. 5 is a block diagram showing the configuration of a clock shaping device 1B according to a second embodiment. A difference from the clock shaping device 1A according to the first embodiment is a voltage controlled SAW oscillation circuit 7B, which is configured in such a manner that an amplifier having a single input terminal and a single output terminal is used instead of the differential amplifier. Hence, the configuration of the voltage controlled SAW oscillation circuit 7B will be described herein.

Referring to FIG. 5, the voltage controlled SAW oscillation circuit 7B comprises at least a SAW resonator X, an oscillation amplifier 77, a feedback buffer amplifier 78, an IC2 which is an IC composed of n plural output amplifiers 79-1, 79-2, . . . , and 79-n, and a voltage controlled phase-shift circuit 44. A forward feedback oscillation loop is formed from at least the oscillation amplifier 77, the feedback buffer amplifier 78, the voltage controlled phase-shift circuit 44, and the SAW resonator X. An output signal from the oscillation amplifier 77 is branched via the plural output amplifiers 79-1, 79-2, . . . , and 79-n, and the resulting signals are used as output signals of the clock shaping device 1B. In this case, for example, an output from the output amplifier 79-n can be used as the feedback loop output signal.

(2-2) Operations in Second Embodiment

Operations in the second embodiment of the invention will now be described with reference to FIG. 5.

Operations from the input of the reception clock signal SR or the back-up clock signal SB up to the output of the control voltage Vc from the loop filter 2 are the same as those in the first embodiment above. The detailed description of the same operations is therefore omitted and only the difference will be described.

Referring to FIG. 5, a resonance signal, generated in the SAW resonator X whose frequency is controlled by the voltage controlled phase-shift circuit 74 into which the control voltage Vc is inputted, is inputted into the oscillation amplifier 77 via an input terminal D of the IC2. An output from the oscillation amplifier 77 is outputted as output signals of the clock shaping device 1B from the output terminals OUT1 through n via the plural output amplifiers 79-1, 79-2, . . . , and 79-n, respectively. The feedback loop output signal S5 is outputted from the output terminal OUTn (LP0) to the phase comparison portion 5.

Operations as described above are repeated in the clock shaping device 1B.

(2-3) Advantages Achieved in Second Embodiment

As has been described, according to the second embodiment, not only the same advantages as those achieved in the first embodiment above, but also advantages such as the following can be achieved.

Conventionally, the output of the clock signal is used also as the feedback loop output, and therefore an output buffer driver IC is needed as an external IC to avoid mutual influence. According to the second embodiment, however, the output signal of the oscillation amplifier is branched via plural output amplifiers provided inside the IC, and one of the outputs of the output amplifiers can be used as the feedback loop output signal. As a consequence, the need to add an extra component, such as an external output buffer driver IC, can be eliminated, which suppresses an increase of the number of components. It is thus possible to achieve an advantage that the size and the cost are reduced.

Also, when the output buffer driver IC is used, wiring used to connect the output amplifier and the output buffer driver IC gives rise to a phase difference between the respective output signals. However, by forming the output signal of the oscillation amplifier via the output amplifiers provided in the IC as in the second embodiment, it is possible to achieve an advantage that no phase difference is generated between the output signals.

(3) THIRD EMBODIMENT

A third embodiment of the invention will now be described.

Figure 6:
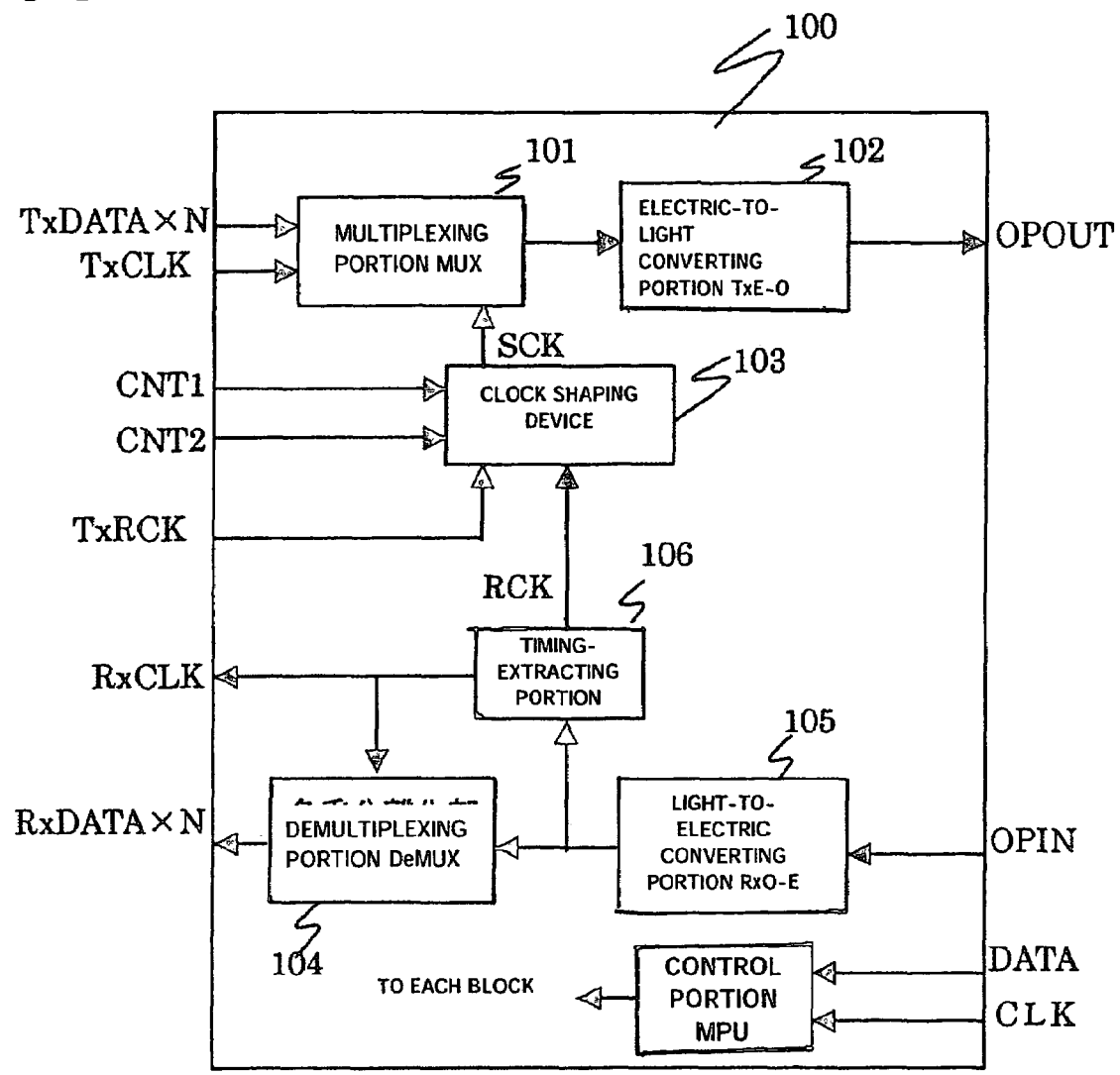
FIG. 6 is a block diagram schematically showing the configuration of an optical transceiver module for an optical network, using the clock shaping device of the invention.
Figure 7:
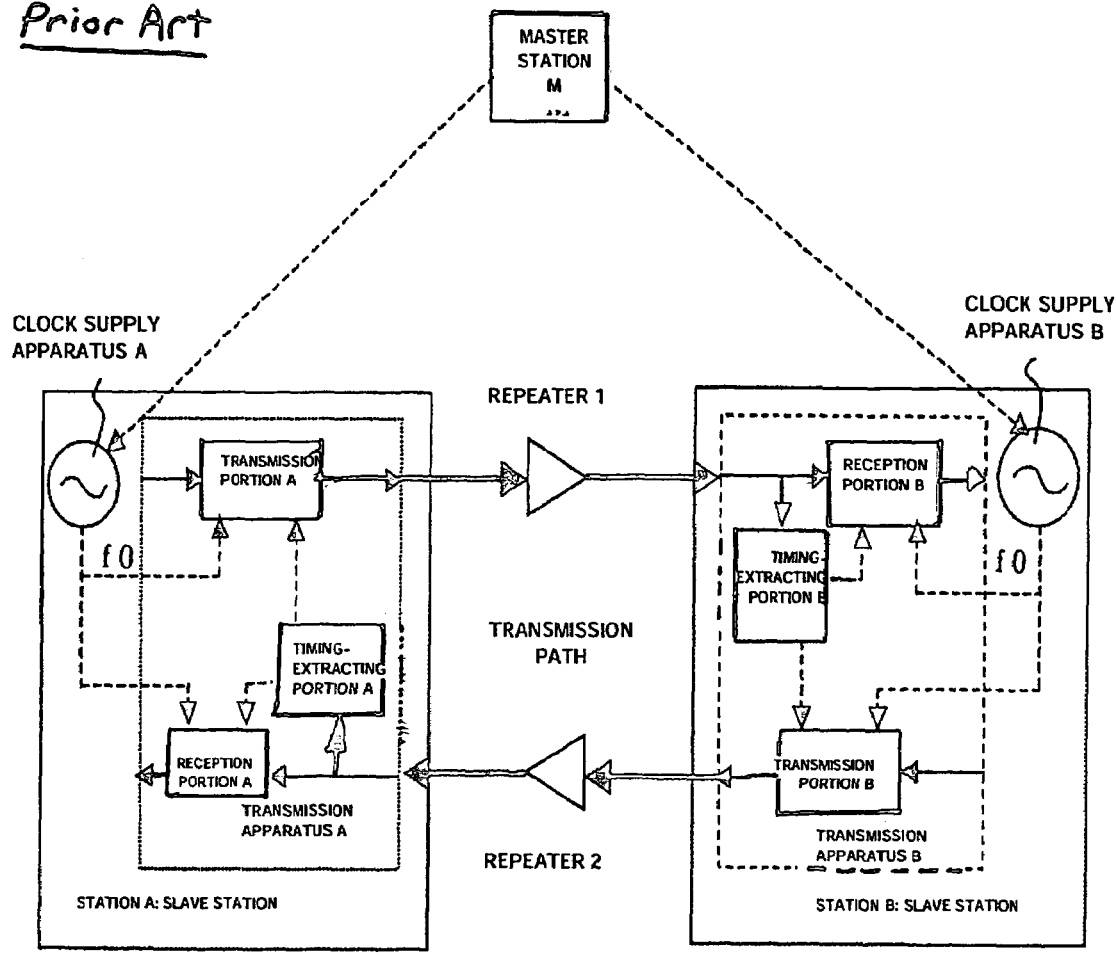
FIG. 7 is a view schematically showing the configuration of a digital network to explain the master-slave synchronization system, which is one type of the network synchronization.
Figure 8:
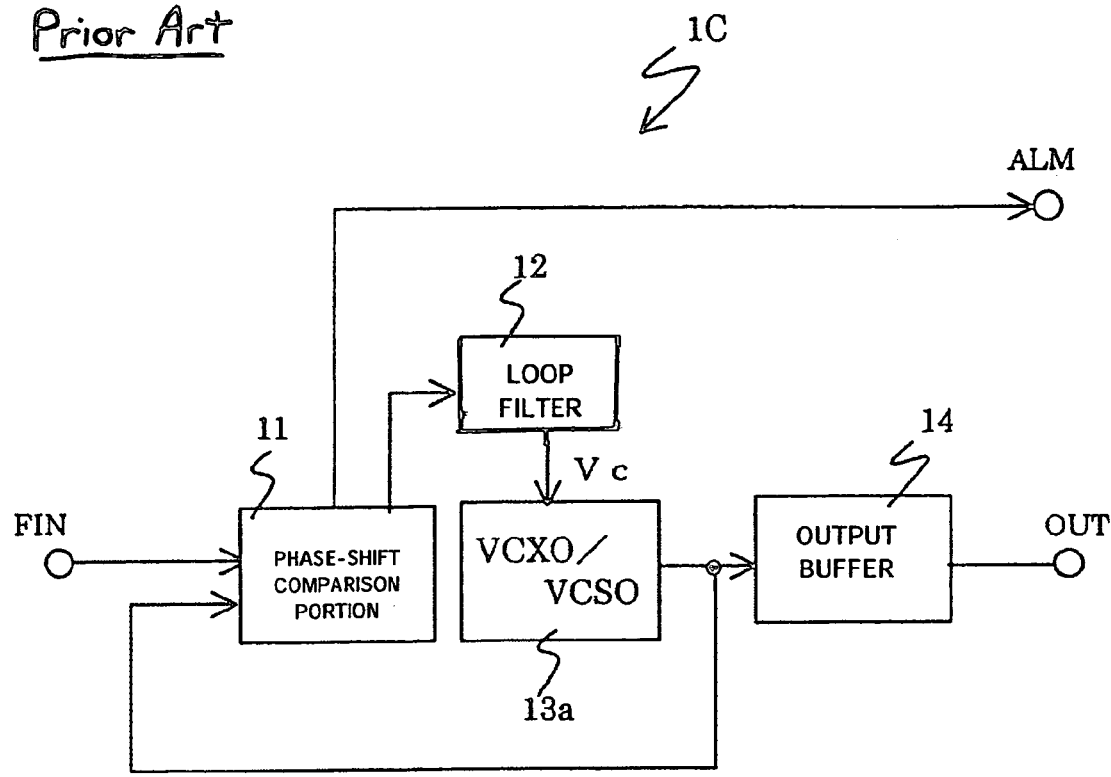
FIG. 8 is a block diagram showing an example of the configuration of a conventional clock shaping device used in a transmission apparatus or the like forming the network synchronization.
Figure 9:
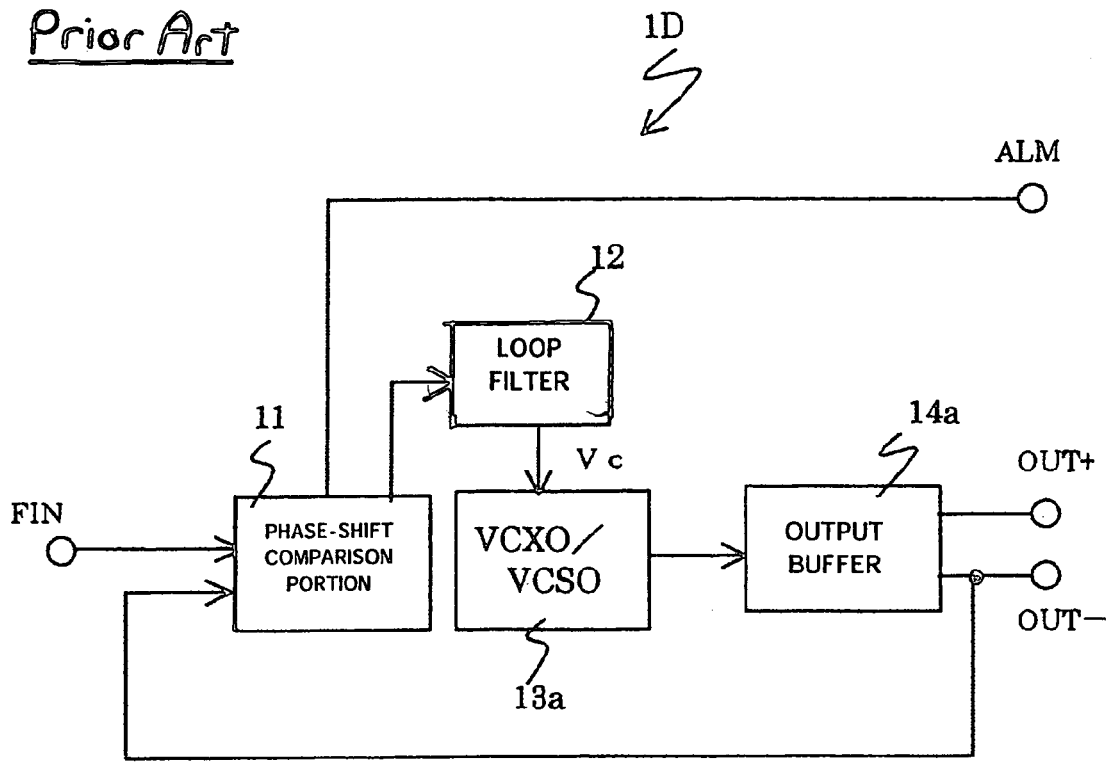
FIG. 9 is a block diagram showing another example of the configuration of a conventional clock shaping device used in a transmission apparatus or the like forming the network synchronization.
Figure 10:
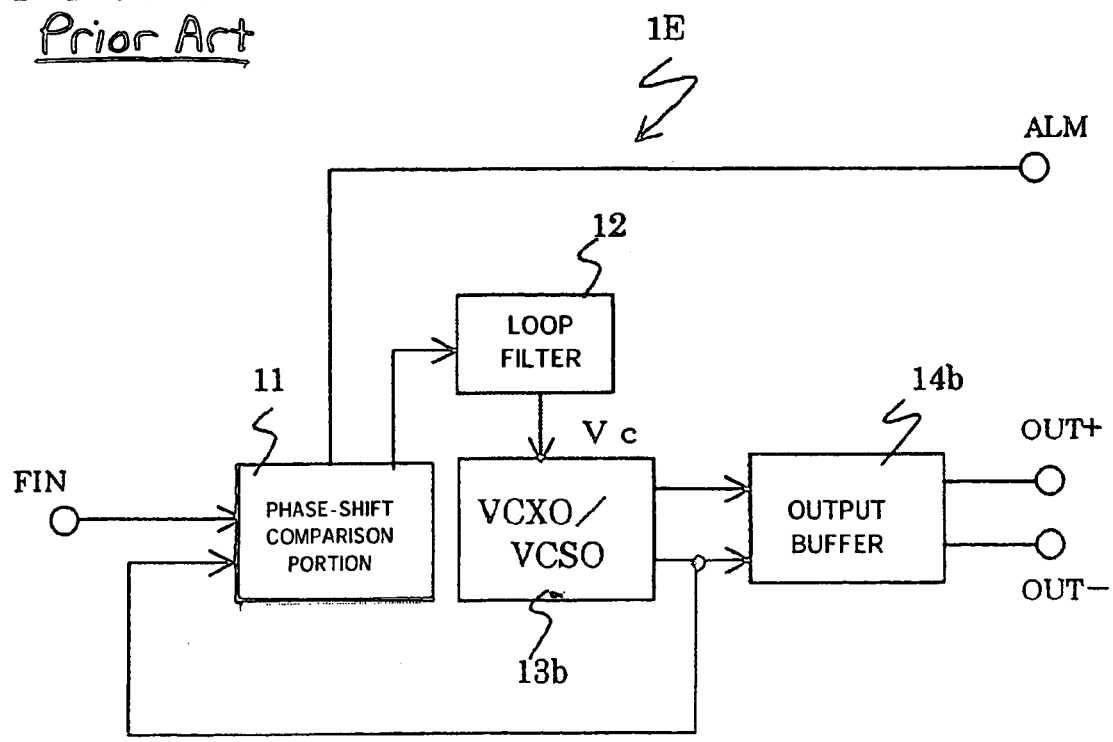
FIG. 10 is a block diagram showing still another example of the configuration of a conventional clock shaping device used in a transmission apparatus or the like forming the network synchronization.

FIG. 6 is a view schematically showing the configuration of an optical transceiver module for an optical network, using the clock shaping device according to the first embodiment described above.

An optical transceiver module 100 achieves an interface function, for example, between a server computer and an optical network for light-to-electric conversion and electric-to-light conversion as well as multiplexing and demultiplexing.

As is shown in FIG. 6, a clock shaping device 103 receives an input of a low-frequency clock signal (RCK) with considerable jitter, which is timing-extracted in a timing-extracting portion 106, and an input of a back-up clock signal (TxRCK) transmitted from an unillustrated, outside clock supply apparatus or the like. In a normal state, the clock signal (RCK) with considerable jitter is selected by the first and second selection signals CNT1 and CNT2 in the clock shaping device 103 of the invention, and shaped into a high-frequency clock signal (SCK) with a little jitter. The clock signal (SCK) is used as a clock signal to multiplex N pieces of transmission data (TxDATA) into a single piece of transmission data in a multiplexing portion 101.

Operations of the optical transceiver module 100 will now be described with reference to FIG. 6.

The timing-extracting portion 106 extracts a high-frequency clock signal from the data of an electric signal converted from a reception optical signal in a light-to-electric converting portion 105. In a normal state where the reception clock signal (RCK) is selected by the first and second selection signals CNT1 and CNT2 in the clock shaping device 100 of the invention, the reception clock signal (RCK) with considerable jitter is converted into a high-frequency clock signal (SCK) with a little jitter in the clock shaping device 103, and transmitted to the multiplexing portion 101. The multiplexed transmission data is then converted into an optical signal (OPOUT) in an electric-to-light converting portion 102, and transmitted to the optical transmission path.

When an omission occurs in the extracted reception clock signal (RCK) due to an error in the reception data for some reason, the reception clock signal (RCK) is switched to the back-up clock signal (TxRCK) from the outside in the clock shaping device 103 by the first selection signal CNT1, and converted into the high-frequency clock signal (SCK). The clock shaping device 103 then transmits the high-frequency clock signal (SCK) to the multiplexing portion 101, and the transmission processing is performed in the same manner as above. In a case where a loss is acknowledged also in the back-up clock signal (TxRCK), the back-up clock signal (TxRCK) is converted to the high-frequency clock signal (SCK) according to the clock signal from the quartz crystal oscillation circuit in the clock shaping device 103 by the second selection signal CNT2 from the outside, and transmitted to the multiplexing portion 61.

In particular, in a case where a delay in detection of an error, such as an omission, in the reception clock signal or the back-up clock signal and a delay of the switching operation occurs on the system side, and such an error is detected in the clock shaping device 103 from the delay, the clock signal is forcibly switched to the back-up clock signal or the clock signal from the quartz crystal oscillation circuit described above in an effective manner.

In other words, by using the clock shaping device 103 of the invention in the optical transceiver module 100, it is possible to detect an omission in the clock signal in the clock shaping device 103 upon occurrence of a loss in the selected clock signal, and thereby to forcibly switch the clock signal to the back-up clock signal or the clock signal from the quartz crystal oscillation circuit held therein. In particular, there can be achieved an advantage that, in a case where a delay in detection of an error, such as an omission, or a delay of the switching operation occurs in the external apparatus or another functional block, the securing of synchronization can be compensated for early by the preferential switching.

Also, in a case where the reception clock signal with considerable jitter is inputted, it is possible to convert such a reception clock signal into a high-frequency clock signal with a very little jitter by means of the clock shaping device 103 of the invention to be supplied to the multiplexing portion 61. This secures a timing margin between the transmission data (TxDATA×N) to be multiplexed in the multiplexing portion 101 and the clock signal. It is thus possible to achieve an advantage that a malfunction of the transmission data of the multiplexing portion 101 can be prevented.

The clock shaping device 1A of the first embodiment was used as an example to describe the third embodiment. It should be appreciated, however, that the same advantages can be achieved when the clock shaping device 1B of the second embodiment is used instead.

(4) MODIFICATION OF EMBODIMENTS

The invention is not limited to the embodiments described above, and can be modified in various manners. For example, modifications such as the following are possible.

A case where the clock shaping device was used in the optical transceiver module for an optical network has been described. However, the clock shaping device may be applied to electronic instruments of various kinds, including wireless communications devices, such as a mobile phone operating at high frequencies.

Also, the clock shaping device has been described by using the SAW resonator, or a so-called surface acoustic wave element, as the clock source. However, it may be configured in such a manner that an AT cut quartz crystal resonator is used instead.

Further, in regard to piezoelectric materials forming a piezoelectric resonator, such as a quartz crystal resonator, a ceramic resonator, and a SAW resonator, langasite and LBO (Lithium Tetraborate), etc. may be used as piezoelectric materials other than quartz crystal.

What is claimed is:

1. A clock shaping device, provided in a transmission apparatus and compensating for network synchronization, for receiving an input of a back-up clock signal in sync with a reference clock signal from a master station and supplied from a clock supply apparatus and an input of reception data from a transmission path, and generating a reception clock signal through timing-extraction from said reception data, said device comprising:

a first clock signal selection portion that receives an input of said reception clock signal and an input of said back-up clock signal, selects either of said clock signals by a first selection signal inputted from outside, monitors, when said reception clock signal is being selected, a loss in said selected reception clock signal, and switches said selected reception clock signal to said back-up clock signal upon detection of said loss;

a quartz crystal oscillation circuit that oscillates at a predetermined frequency;

a second clock signal selection portion that receives an input of a clock signal from said first clock signal selection portion and an input of a clock signal from said quartz crystal oscillation circuit, selects either of said clock signals by a second selection signal inputted from outside, monitors, when said back-up clock signal is being selected, a loss in said selected back-up clock signal, and switches said back-up clock signal to said clock signal from said quartz crystal oscillation circuit upon detection of said loss;

a voltage controlled oscillation circuit having a frequency that varies with a control voltage being supplied, and generates and outputs a feedback loop output signal;

a phase comparison portion that generates a phase difference signal based on a result of comparing said feedback loop output signal from said voltage controlled oscillation circuit and a clock signal outputted from said second clock signal selection portion; and a loop filter that smoothes said phase difference signal and outputs said phase difference signal in the form of said control voltage, wherein the voltage controlled oscillation circuit includes a forward feedback oscillation loop circuit that outputs said feedback loop output signal and a forward feedback oscillation loop output signal, said forward feedback oscillation loop circuit including:

a voltage controlled phase-shift circuit that outputs an output signal by shifting a phase of an input signal by a given quantity with said control voltage;

a SAW resonator that resonates at a predetermined resonance frequency;

an oscillation differential amplifier that amplifies a resonance signal at said predetermined resonance frequency and outputs an amplified resonance signal; and a feedback buffer differential amplifier that receives an input of said amplified resonance signal from said oscillation differential amplifier, wherein one of an inverting output terminal and a non-inverting output terminal provided to said feedback buffer differential amplifier outputs said feedback loop output signal and the other output terminal outputs said forward feedback oscillation loop output signal.

2. The clock shaping device according to claim 1, wherein said first clock signal selection portion further comprises:

a first selection portion that receives an input of said reception clock signal and an input of said back-up clock signal, and selects and outputs either of said clock signals by said first selection signal;

a reception clock signal loss detection portion that detects a loss in said reception clock signal when said reception clock signal is being selected in said first selection portion, and outputs said detection to said first selection portion in the form of a first switching signal, and wherein said first clock signal selection portion switches said reception clock signal to said back-up clock signal by said first switching signal given with precedence over said first selection signal.

3. The clock shaping device according to claim 1, wherein said second clock signal selection portion further comprises:

a second selection portion that receives an input of a clock signal outputted from said first clock signal selection portion and an input of a clock signal outputted from said quartz crystal oscillation circuit, and selects and outputs either of said clock signals by said second selection signal; and a back-up clock signal loss detection portion that detects a loss in said back-up clock signal when said back-up clock signal is being selected in said second selection portion, and outputs said detection to said second selection portion in the form of a second switching signal, and wherein said second clock signal selection portion switches said back-up clock signal to said clock signal from said quartz crystal oscillation circuit by said second switching signal given with precedence over said second selection signal.

4. The clock shaping device according to claim 1, wherein said phase comparison portion further comprises:

first dividing means for dividing a clock signal selected by said second clock signal selecting portion; and second dividing means for dividing said feedback loop output signal.

5. The clock shaping device according to claim 1, wherein:

each of said oscillation differential amplifier and said feedback buffer differential amplifier further comprises a differential amplifier circuit using an ECL line receiver.

6. An electronic instrument, characterized by being provided with the clock shaping device according to claim 1.

7. A clock shaping device, provided in a transmission apparatus and compensating for network synchronization, for receiving an input of a back-up clock signal in sync with a reference clock signal from a master station and supplied from a clock supply apparatus and an input of reception data from a transmission path, and generating a reception clock signal through timing-extraction from said reception data, said device comprising:

a first clock signal selection portion that receives an input of said reception clock signal and an input of said back-up clock signal, selects either of said clock signals by a first selection signal inputted from outside, monitors, when said reception clock signal is being selected, a loss in said selected reception clock signal, and switches said selected reception clock signal to said back-up clock signal upon detection of said loss;

a quartz crystal oscillation circuit that oscillates at a predetermined frequency;

a second clock signal selection portion that receives an input of a clock signal from said first clock signal selection portion and an input of a clock signal from said quartz crystal oscillation circuit, selects either of said clock signals by a second selection signal inputted from outside, monitors, when said back-up clock signal is being selected, a loss in said selected back-up clock signal, and switches said back-up clock signal to said clock signal from said quartz crystal oscillation circuit upon detection of said loss;

a voltage controlled oscillation circuit having a frequency that varies with a control voltage being supplied, and generates and outputs a feedback loop output signal;

a phase comparison portion that generates a phase difference signal based on a result of comparing said feedback loop output signal from said voltage controlled oscillation circuit and a clock signal outputted from said second clock signal selection portion; and a loop filter that smoothes said Phase difference signal and outputs said phase difference signal in the form of said control voltage, wherein the voltage controlled oscillation circuit includes:

a forward feedback oscillation loop circuit that outputs said feedback loop output signal and a forward feedback oscillation loop output signal;

a voltage controlled phase-shift circuit that outputs an output signal by shifting a phase of an input signal by a given quantity with said control voltage;

a SAW resonator that resonates at a predetermined resonance frequency;

an oscillation amplifier that amplifies a resonance signal at said predetermined resonance frequency and outputs an amplified resonance signal; and a feedback buffer amplifier that receives an input of said amplified resonance signal from said oscillation amplifier, wherein:

said forward feedback oscillation loop circuit is formed from at least said voltage controlled phase-shift circuit, said SAW resonator, said oscillation amplifier, and said feedback buffer amplifier;

plural output amplifiers are further included; and an output signal from said oscillation amplifier is branched via said plural output amplifiers, and any one of the branched output signals is used as said feedback loop output signal.

* * * * *